United States Patent
Couland

Patent Number: 6,140,585
Date of Patent: *Oct. 31, 2000

[54] WIRE TELECOMMUNICATION EQUIPMENT WITH PROTECTION AGAINST ELECTROMAGNETIC INTERFERENCE

[75] Inventor: Charles Couland, Orsay, France

[73] Assignee: FIHEM, France

[*] Notice: This patent issued on a continued prosecution application filed under 37 CFR 1.53(d), and is subject to the twenty year patent term provisions of 35 U.S.C. 154(a)(2).

[21] Appl. No.: 08/962,629

[22] Filed: Nov. 3, 1997

[30] Foreign Application Priority Data

Nov. 4, 1996 [FR] France ................................. 96 13394

[51] Int. Cl.⁷ ..................................................... H01B 7/02
[52] U.S. Cl. ...................... 174/70 R; 174/235; 174/260; 174/261; 361/780
[58] Field of Search .................................. 174/70 R, 260, 174/255, 261; 361/763, 777, 778, 779, 780, 782

[56] References Cited

U.S. PATENT DOCUMENTS

| | | | |
|---|---|---|---|
| 3,585,399 | 6/1971 | Andrews | 326/30 |
| 4,328,531 | 5/1982 | Nagashima et al. | 361/762 |
| 5,006,822 | 4/1991 | Reddy | 333/112 |
| 5,269,708 | 12/1993 | DeYoung et al. | 439/676 |
| 5,326,284 | 7/1994 | Bohbot et al. | 439/676 |
| 5,449,948 | 9/1995 | Inoue et al. | 257/531 |
| 5,618,185 | 4/1997 | Aekins | 439/76.1 |
| 6,040,984 | 3/2000 | Hirakawa | 174/260 |
| 6,043,987 | 3/2000 | Goodwin et al. | 174/260 |
| 6,054,720 | 4/2000 | Fieselman et al. | 174/261 |
| 6,058,022 | 5/2000 | Gianni et al. | 361/780 |

FOREIGN PATENT DOCUMENTS

| | | |
|---|---|---|
| 2729510 | 7/1996 | France . |
| 2268336 | 1/1994 | United Kingdom . |

*Primary Examiner*—Kristine Kincaid
*Assistant Examiner*—Adolfo Nino
*Attorney, Agent, or Firm*—Piper Marbury Rudnick & Wolfe

[57] ABSTRACT

The equipment includes two connectors for connection to two respective lines, and a multilayer printed circuit, one region of which supports signal processing components, each of the lines including at least two electrical conductors. The printed circuit incorporates essentially inductive electrical links between the connectors and the components. The printed circuit further incorporates metallizations associated with the two connectors which link them respectively to the conductors of the two lines. These metallizations belong to different layers of the printed circuit and are situated facing one another so as to produce capacitive coupling between the two lines so that a fast electromagnetic disturbance arising on one of the lines is diverted to the other line rather than reaching the signal processing components.

17 Claims, 2 Drawing Sheets

WIRE TELECOMMUNICATION EQUIPMENT WITH PROTECTION AGAINST ELECTROMAGNETIC INTERFERENCE

BACKGROUND OF THE INVENTION

The present invention relates to the field of the protection of telecommunication equipment against electromagnetic interference of the fast transient type.

An item of equipment for which such protection is relevant is of the type which includes first and second connectors for connection to first and second lines respectively, and a multilayer printed circuit, one region of which supports signal processing components, each of the first and second lines including at least two electrical conductors, the printed circuit incorporating electrical links between the connectors and said components.

Typically, it may be a digital network equipment such as a digital network termination (NT) or else a repeater. A NT is an item of equipment which is placed in the vicinity of a digital subscriber site (for example on an apartment landing) and which provides for the signal transformations, as required by the digital transmission protocols and formats employed, between a network line connected to an interface of the NT referred to as the U interface and a subscriber line connected to another interface of the NT referred to as the S interface.

It is generally specified that an item of equipment such as a NT may be close (a few centimetres) to an electrically earthed element (for example the reinforcing bars of a reinforced-concrete wall on which would be installed a compartment intended for receiving the equipment). Under these conditions, the electromagnetic disturbances caused by shutdowns of electric motors, or of other inductive loads, situated near the equipment may be induced by coupling in the lines attached to the equipment. Such interferences may be of large amplitude with very short rise times (several hundred volts in a few nanoseconds). They flow away to earth, dying out relatively rapidly in the cables. However, it is advisable to prevent them from being able to reach the signal processing components of the equipment, else they would bring about transmission errors.

In general, such protection is achieved by providing for the electrical links between the connectors of the equipment and the signal processing components to be inductive, small inductance coils being mounted for this purpose on the printed circuit close to the connectors. However, the stray capacitances existing between the adjacent turns of a coil reduce its impedance with regard to the fastest disturbances, thus substantially limiting the effectiveness of the protection.

An object of the present invention is to propose simple and economical means for efficiently immunizing the equipment against intense and rapid interference.

SUMMARY OF THE INVENTION

The invention thus proposes an item of equipment of the type indicated at the outset, wherein the printed circuit further incorporates first metallizations associated with the first connector which links them respectively to the conductors of the first line, and second metallizations associated with the second connector which links them respectively to the conductors of the second line, and wherein the first metallizations and the second metallizations belong to different layers of the printed circuit and are situated facing one another so as to produce capacitive coupling between the two lines.

In the presence of high-frequency interference, the capacitive coupling built into the printed circuit affords low impedance between the two lines. High-frequency interference occurring on one of the two lines can then be diverted to the other line, where it will die out without reaching the signal processing components.

In addition to its effectiveness, this protection of the equipment has the advantage of costing nothing since it calls simply for a judicious design of the layers of the printed circuit and not for discrete filtering components.

To limit the propagation by radiation of a disturbance towards the signal processing components, the region of the printed circuit which supports them includes an earth plane remote from the connectors and from the first and second metallizations. Also, to limit the propagation by conduction, the electrical links between the connectors and the signal processing components are arranged in such a way that they are essentially inductive, with minimal stray capacitance. Provision is therefore made for these links to consist essentially of substantially parallel metal tracks which the connectors link respectively to the electrical conductors of the lines.

DESCRIPTION OF PREFERRED EMBODIMENTS

Figure 1A:
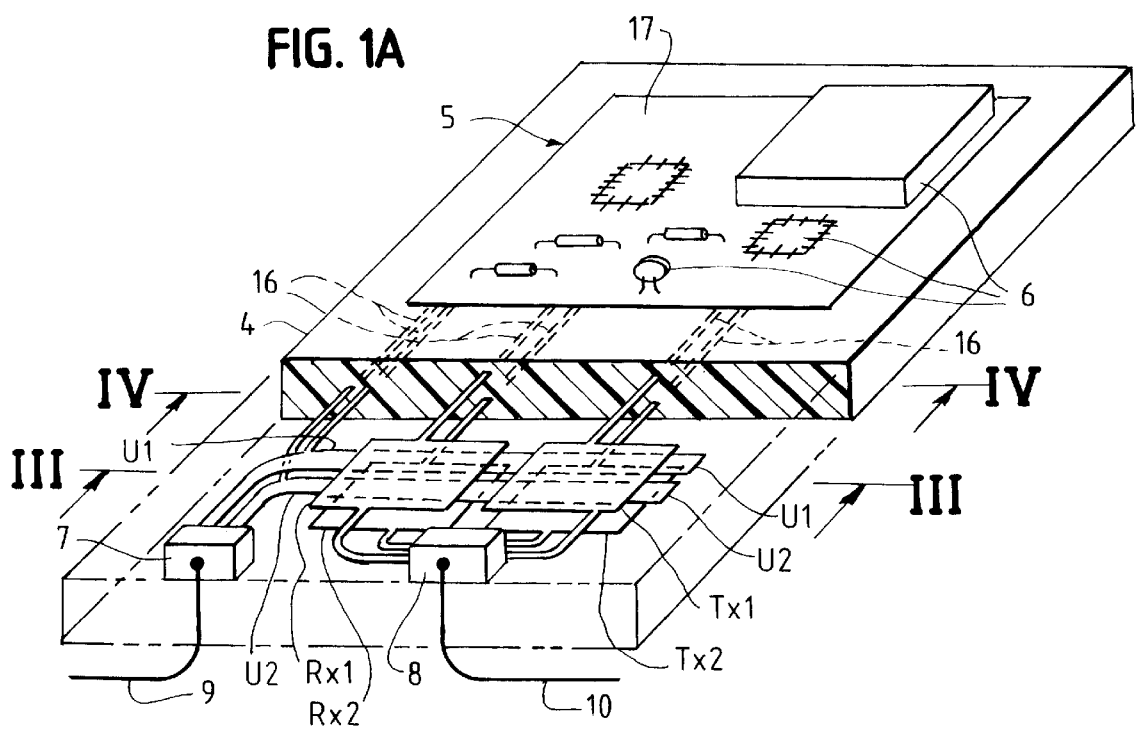
FIG. 1A shows a part perspective/part cross sectional view of an item of equipment according to the invention.

FIG. 1A illustrates the application of the present invention to wire telecommunication equipment consisting of a digital network termination (NT). The NT comprises a multilayer printed circuit 4 of rectangular general shape, one region 5 of which supports signal processing components 6. On the edge of the printed circuit 4 opposite the region 5 are stationed two connectors, one 7 constituting a U interface for connection to a network line 9, and the other 8 constituting an S interface for connection to a subscriber line 10.

Involving as it does an integrated services digital network (ISDN), the network line 9 connected to the U interface is conventionally composed of two electrical conductors affording a 160-kbit/s bidirectional link, and the subscriber line 10 connected to the S interface is composed of four conductors affording two 192-kbit/s reverse links. The components 6 provide, in a conventional manner, for the signal transformations required between the U and S interfaces.

Figure 1B:
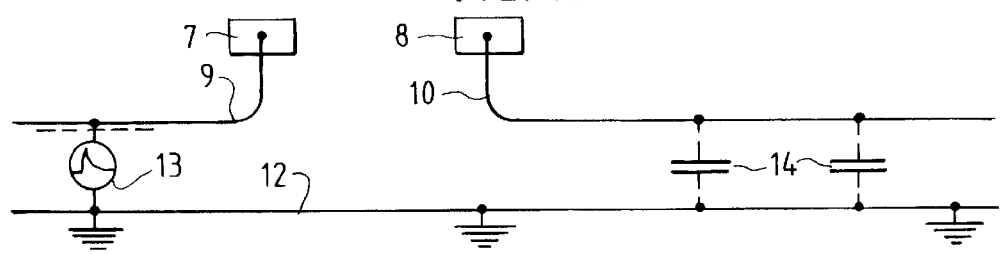
FIG. 1B is a schematic perspective of the generation of transients which are coupled to the equipment shown in FIG. 1A.

Represented in FIG. 1B is the electrical earth 12 assumed to be close to the NT. The reference 13 symbolizes a generator of rapid transients which, because of the nearness of the earth 12, may be induced by coupling in one of the lines connected to the connectors 7, 8, namely the network line 9 in the particular case considered. In practice, these transients may be generated by shutdowns of inductive loads such as motors (e.g. a vacuum-cleaner motor), located in proximity to the NT. These transients may bring about voltage variations of several hundred volts over a few nanoseconds. Means should be provided to ensure that such disturbances do not reach the signal processing components 6 of the NT.

For this purpose, the invention advocates diverting these disturbances to the other line 10 connected to the NT, where they will be able to die out fairly rapidly given the capacitive couplings existing with the earth 12, and symbolized by the capacitors 14 in FIG. 1B.

This diverting of the disturbances is carried out by virtue of capacitive coupling between the connectors 7, 8, obtained by means of metallizations judiciously arranged in the layers of the printed circuit 4 and which form capacitor plates. This capacitive coupling must be sufficient to efficiently immunize the components 6 against fast disturbances, without being too large so as to avoid impairing the signals in the transmission bandwidth. It has been determined that, in the case of the numerical values mentioned earlier for an ISDN, the overall capacitive coupling between the two lines 9, 10 is advantageously between 150 and 300 picofarads.

Figure 3:
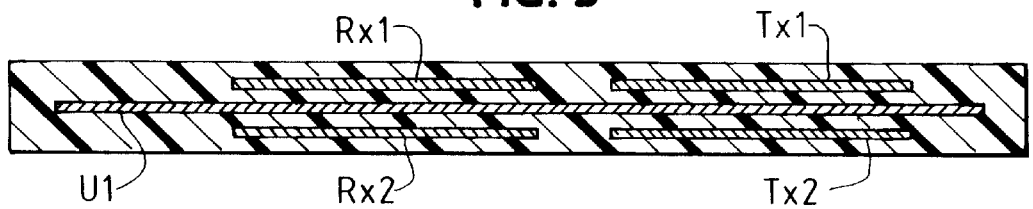
FIG. 3 is a cross section of the equipment taken along line III—III of FIG. 1.
Figure 4:
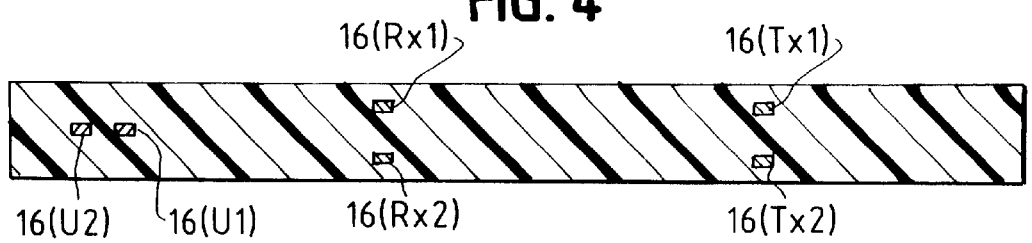
FIG. 4 is a cross section of the equipment taken along line IV—IV of FIG. 1.

As seen in FIGS. 1, 3, and 4, the metallizations U1, U2, Rx1, Rx2, Tx1, Tx2 are situated near the connectors 7, 8 which link each of them to a respective conductor of one of the lines 9, 10. Metal tracks 16 run within the printed circuit 4 between the metallizations U1, U2, Rx1, Rx2, Tx1, Tx2 and the region 5 supporting the components 6, where these tracks are connected appropriately to the components 6.

The cross section shown in FIG. 3 shows another view of the metallizations U1, Rx1, Rx2, Tx1, Tx2. While metallization U2 is not shown in FIG. 3, it will be appreciated from FIG. 1 that it is arranged in the same horizontal plane as metallization U1. FIG. 4 shows a cross section of the metal tracks 16.

As FIG. 1A shows, the region 5 includes a metallized earth plane 17 serving, as is usual in the art of printed circuits, to distribute the potential of the earth to the components 6 which need it. This earth plane 17 is remote from the connectors 7, 8 and from the metallizations U1, U2, Rx1, Rx2, Tx1, Tx2, so as to minimize the risk of it being reached by a fast disturbance propagating by radiation from the opposite edge of the printed circuit. The earth plane 17 is preferably at least 2 centimetres away from the connectors and from the metallizations.

Between the earth plane 17 and the metallizations U1, U2, Rx1, Rx2, Tx1, Tx2, the tracks 16 are parallel and narrow, for example rectilinear, so as to be essentially inductive while minimizing the capacitive couplings. The longitudinal inductance of each track pair 16 is preferably at least 20 nanohenrys.

In the arrangement represented in FIG. 1A, the two metallizations U1, U2 associated with the connector 7 of the U interface consist of two strips situated in the same layer of the printed circuit 4 parallel to the edge where the connectors 7, 8 are located. The two metallizations Rx1, Rx2 associated with the connector of the S interface in respect of the receive direction consist of two plates having the same substantially square shape, situated facing one another in two layers of the printed circuit 4 which are located either side of the layer of the metallizations U1, U2. These metallizations Rx1, Rx2 sandwich between them a portion of each of the strips constituting the metallizations U1, U2 in such a way as to produce the desired capacitive coupling. The two metallizations Tx1, Tx2 associated with the connector of the S interface in respect of the transmit direction consist of two plates having the same substantially square shape, situated facing one another in the same layers as the metallizations Rx1, Rx2. These metallizations Tx1, Tx2 sandwich between them another portion of each of the strips constituting the metallizations U1, U2 in such a way as to produce the desired capacitive coupling.

It will be noted that where the invention is applied to an item of equipment, such as a repeater, which is connected to two lines each having two conductors only, it will be possible to adopt an arrangement similar to that of FIG. 1A, while removing one of the pairs of metallizations represented, for example the pair Tx1, Tx2.

Figure 2:
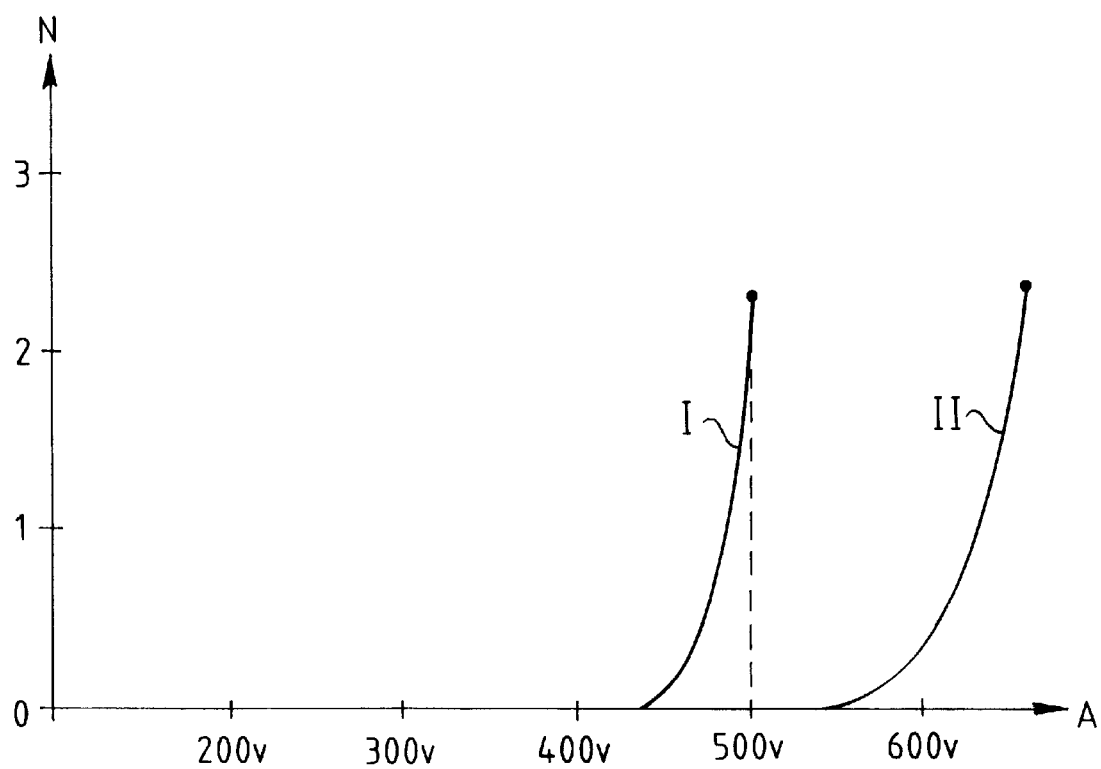
FIG. 2 is a graph showing the improvement afforded by the invention as regards the error rate observed in the presence of fast disruption.

The effectiveness of the protection against fast disturbances can be appreciated in the graph of FIG. 2, obtained by measuring the mean number N of transmission faults per minute on a 64-kbit/s channel as a function of the amplitude A of the fast transients generated in one of the two lines. The curve I represents the number of faults observed in the absence of protection by capacitive coupling according to the invention. It may be seen that for an amplitude of 500 volts, specified by certain standards, the number of transmission faults is significant, whereas this number is negligible when the protection according to the invention is employed (curve II). For a given number of faults, the equipment according to the invention is capable of coping with fast disturbances of substantially greater amplitude. Curve II has been obtained in a case in which the overall capacitive coupling C between the two lines was 160 pF, the inductance L of each pair of tracks 16 was of the order of 20 nH and the distance d between the earth plane 17 and the metallizations U1, U2, Rx1, Rx2, Tx1, Tx2 was 2 cm. The immunity of the circuit was then around 650 V instead of around 450 V in the absence of capacitive coupling. In another example in which C=220 pF, L=40 nH and d=4 cm, an immunity of around 900 V was observed.

What is claimed is:

1. Telecommunication equipment for providing an interface between a first line and a second line, each of the first and second line including at least two electrical conductors, the telecommunication equipment comprising:

a first connector for connection to the first line;

a second connector for connection to the second line;

signal processing components; and a multilayer printed circuit which includes a plurality of layers, a first region which supports said signal processing components, a second region which supports the first and second connectors, first electrical links electrically coupling the first connector to said signal processing components, second electrical links electrically coupling the second connector to said signal processing components, and means for diverting electromagnetic interference developed in one of the first and second lines to the other of the first and second lines and away from the signal processing components, the diverting means being located within the second region and spaced apart from the first region, the diverting means being coupled between the first and second connectors, whereby the first line is capacitively coupled to the second line and electromagnetic interference developed in the one of the first and second lines is diverted to the other of the first and second lines and away from the signal processing components.

2. The telecommunication equipment of claim 1, wherein the diverting means have first metallizations electrically connected to the first connector and located in at least one of said plurality of layers, and second metallizations electrically connected to the second connector and located in at least one of said plurality of layers, the first metallizations and the second metallizations being spaced apart in opposing relationship to form capacitive coupling between the first and second connectors.

3. Equipment according to claim 2, wherein said capacitive coupling between the two lines is 150 to 300 picofarads.

4. Equipment according to claim 2, wherein the first region of the printed circuit supporting the signal processing components includes an earth plane remote from the connectors and from the first and second metallizations.

5. Equipment according to claim 4, wherein the earth plane is at least 2 centimetres away from the connectors and from the first and second metallizations.

6. Equipment according to claim 4, wherein said electrical links between the first and second connectors and said components consist essentially of substantially parallel metal tracks which the connectors link respectively to the electrical conductors of the lines.

7. Equipment according to claim 6, wherein said metal tracks are arranged in pairs and each pair of metal tracks exhibits a longitudinal inductance of at least 20 nanohenrys.

8. Equipment according to claim 2, wherein the first line includes two conductors while the second line includes four conductors, wherein the first metallizations are situated in a first layer of the printed circuit, and wherein the second metallizations are distributed into second and third layers of the printed circuit which are situated either side of said first layer.

9. Equipment according to claim 8, wherein the first metallizations consist of two strips substantially parallel to an edge of the printed circuit at which the connectors are situated, and the second metallizations consist of two pairs of plates, the plates of each pair being placed facing one another and sandwiching two respective portions of said strips.

10. Telecommunication equipment for providing an interface between a first line and a second line, each of the first and second line including at least two electrical conductors, the telecommunication equipment comprising:

a first connector for connection to the first line;

a second connector for connection to the second line;

signal processing components; and a multilayer printed circuit which includes a plurality of layers, a first region which supports said signal processing components, a second region, spaced apart from the first region, which supports the first and second connectors, first electrical links electrically coupling the first connector to said signal processing components, second electrical links electrically coupling the second connector to said signal processing components, first metallizations electrically connected to the first connector and located within the second region and in at least one of said plurality of layers, and second metallizations electrically connected to the second connector and located within the second region and in at least one of said plurality of layers, the first metallizations and the second metallizations being spaced apart in opposing relationship to form capacitive coupling between the first and second connectors, whereby the first line is capacitively coupled to the second line and electromagnetic interference developed in one of the first and second lines is diverted to the other of the first and second lines and away from the signal processing components.

11. Equipment according to claim 10, wherein said capacitive coupling between the two lines is 150 to 300 picofarads.

12. Equipment according to claim 10, wherein the first region of the printed circuit supporting the signal processing components includes an earth plane remote from the connectors and from the first and second metallizations.

13. Equipment according to claim 12, wherein the earth plane is at least 2 centimetres away from the connectors and from the first and second metallizations.

14. Equipment according to claim 12, wherein said electrical links between the first and second connectors and said signal processing components consist essentially of substantially parallel metal tracks which the connectors link respectively to the electrical conductors of the lines.

15. Equipment according to claim 14, wherein said metal tracks exhibit a longitudinal inductance of at least 30 nanohenrys for each pair of tracks.

16. Equipment according to claim 10, wherein the first line includes two conductors while the second line includes four conductors, wherein the first metallizations are situated in a first layer of the printed circuit, and wherein the second metallizations are distributed into second and third layers of the printed circuit which are situated either side of said first layer.

17. Equipment according to claim 16, wherein the first metallizations consist of two strips substantially parallel to an edge of the printed circuit at which the connectors are situated, and the second metallizations consist of two pairs of plates, the plates of each pair being placed facing one another and sandwiching two respective portions of said strips.

* * * * *